(12) United States Patent
Kaneko et al.

(10) Patent No.: US 9,711,590 B2
(45) Date of Patent: Jul. 18, 2017

(54) SEMICONDUCTOR DEVICE, OR CRYSTAL

(71) Applicant: FLOSFIA INC., Kyoto-shi (JP)

(72) Inventors: Kentaro Kaneko, Kawachinagano (JP); Toshimi Hitora, Osaka (JP); Takashi Hirao, Suita (JP)

(73) Assignee: FLOSFIA, INC., Kyoto (JP)

( * ) Notice: Subject to any disclaimer, the term of this patent is extended or adjusted under 35 U.S.C. 154(b) by 0 days.

(21) Appl. No.: 14/233,699

(22) PCT Filed: Sep. 24, 2013

(86) PCT No.: PCT/JP2013/075659
§ 371 (c)(1),
(2) Date: Jan. 17, 2014

(87) PCT Pub. No.: WO2014/050793
PCT Pub. Date: Apr. 3, 2014

(65) Prior Publication Data
US 2015/0194479 A1     Jul. 9, 2015

(30) Foreign Application Priority Data

Sep. 28, 2012  (JP) ................................ 2012-218891

(51) Int. Cl.
*H01L 29/04*   (2006.01)
*C30B 29/22*   (2006.01)
(Continued)

(52) U.S. Cl.
CPC .............. *H01L 29/04* (2013.01); *C30B 25/02* (2013.01); *C30B 29/20* (2013.01); *C30B 29/22* (2013.01);
(Continued)

(58) Field of Classification Search
CPC ........... H01L 21/0242; H01L 21/02178; H01L 21/31616
See application file for complete search history.

(56) References Cited

U.S. PATENT DOCUMENTS 6,096,285 A * 8/2000 Hayashi ................. C01G 19/00
423/115
7,132,691 B1 * 11/2006 Tanabe .................. B82Y 20/00
257/103
(Continued)

FOREIGN PATENT DOCUMENTS

CN   102239549 A   11/2011
JP   11-016900 A   1/1999
(Continued)

OTHER PUBLICATIONS

Taiwanese Office Action, mailed May 27, 2015, issued in Publication No. TW 102134563, published Jul. 27, 2011, 8 pages.
(Continued)

*Primary Examiner* — Jaehwan Oh
(74) *Attorney, Agent, or Firm* — Christensen O'Connor Johnson Kindness PLLC

(57) ABSTRACT

There is provided a semiconductor device including corundum crystal films of good quality. There is provided a semiconductor device including a base substrate, a semiconductor layer, and an insulating film each having a corundum crystal structure. Materials having a corundum crystal structure include many types of oxide films capable of functioning as an insulating film. Since all the base substrate, the semiconductor layer, and the insulating film have a corundum crystal structure, it is possible to achieve a semiconductor layer and an insulating film of good quality on the base substrate.

20 Claims, 5 Drawing Sheets

(51) Int. Cl.
*H01L 21/02* (2006.01)
*C30B 25/02* (2006.01)
*C30B 29/20* (2006.01)
*H01L 29/24* (2006.01)

(52) U.S. Cl.
CPC ...... *H01L 21/0237* (2013.01); *H01L 21/0242* (2013.01); *H01L 21/0262* (2013.01); *H01L 21/02488* (2013.01); *H01L 21/02565* (2013.01); *H01L 21/02609* (2013.01); *H01L 21/02628* (2013.01); *H01L 29/24* (2013.01)

(56) References Cited

U.S. PATENT DOCUMENTS

| | | | | |
|---|---|---|---|---|
| 2002/0033521 | A1* | 3/2002 | Matsuoka | C30B 25/02 257/627 |
| 2004/0164281 | A1* | 8/2004 | Abe | C04B 35/01 252/500 |
| 2006/0163605 | A1* | 7/2006 | Miyahara | C04B 35/453 257/103 |
| 2006/0194886 | A1* | 8/2006 | Adam | B01J 13/0086 516/99 |
| 2006/0263640 | A1 | 11/2006 | Tamagaki | |
| 2006/0292833 | A1* | 12/2006 | Matsushita | H01L 29/045 438/462 |
| 2007/0164117 | A1* | 7/2007 | Swiler | B05D 5/06 235/491 |
| 2010/0302292 | A1* | 12/2010 | Dockery | C09D 11/38 347/9 |
| 2011/0024875 | A1* | 2/2011 | Takebayashi | C23C 16/40 257/532 |
| 2011/0233689 | A1 | 9/2011 | Hata et al. | |
| 2012/0061663 | A1* | 3/2012 | Yamazaki | H01L 21/02488 257/43 |
| 2012/0112184 | A1 | 5/2012 | Yamazaki et al. | |
| 2012/0132907 | A1* | 5/2012 | Yamazaki | H01L 21/02472 257/43 |
| 2012/0211760 | A1* | 8/2012 | Yamada | H01L 29/2003 257/76 |

FOREIGN PATENT DOCUMENTS

| | | |
|---|---|---|
| JP | 2010-510167 A | 4/2010 |
| JP | 2012-084867 A | 4/2012 |
| JP | 2012-114426 A | 6/2012 |
| JP | 2012-129511 A | 7/2012 |
| JP | 2012-238861 A | 12/2012 |
| KR | 10-2011-0088976 A | 9/2011 |
| KR | 10-2012-0028228 A | 3/2012 |
| WO | 2013/035843 A1 | 3/2013 |

OTHER PUBLICATIONS

Kawaharamura, T., et al., "Successful Growth of Conductive Highly Crystalline Sn-Doped α-$Ga_2O_3$ Thin Films by Fine-Channel Mist Chemical Vapor Deposition," Japanese Journal of Applied Physics 51(4):040207-1-040207-3, Mar. 2012.

Shinohara, D., and S. Fujita, "Heteroepitaxy of Corundum-Structured α-$Ga_2O_3$ Thin Films on α-$Al_2O_3$ Substrates by Ultrasonic Mist Chemical Vapor Deposition," Japanese Journal of Applied Physics 47(9):7311-7313, Sep. 2008.

International Search Report and Written Opinion dated Dec. 17, 2013, issued in corresponding International Application No. PCT/JP2013/075659, filed Sep. 24, 2013, 11 pages.

Extended European Search Report, mailed Dec. 4, 2014, issued in corresponding European Application No. 13817841.3, filed Sep. 24, 2013, 6 pages.

Kaneko, K., et al., "Evaluation of Misfit Relaxation in α-Ga2O3 Epitaxial Growth on α-Al2O3 Substrate," Japanese Journal of Applied Physics 51(2R):020201-1-020201-3, Feb. 2012.

Kaneko, K., et al., "Fabrication of Highly Crystalline Corundum-Structured α-(Ga1—xFex)2O3 Alloy Thin Films on Sapphire Substrates," Applied Physics Express 2(7):075501-1-075501-3, Jul. 2009.

Office Action, mailed Apr. 3, 2015, from the Korean Intellectual Property Office, issued in Application No. 10-2014-7002063, filed Jan. 24, 2014, 14 pages.

Masuda, T., et al., "High Channel Mobility of 4H—SiC MOSFET Fabricated on Macro-Stepped Surface," Materials Science Forum 600-603:695-698, 2009.

Office Action mailed Mar. 14, 2016, issued in corresponding Chinese Application No. 201380002360, filed Sep. 24, 2013, with machine translation, 16 pages.

Office Action mailed Jul. 19, 2016, issued in Japanese Application No. 2013-212623, filed Oct. 10, 2013, with machine translation, 7 pages.

Akaiwa, K., and S. Fujita, "Electrical Conductive Corundum-Structured α-Ga2O3 Thin Films on Sapphire with Tin-Doping Grown by Spray-Assisted Mist Chemical Vapor Deposition," Japanese Journal of Applied Physics 51(7r):70203-1-070203-3, Jul. 2012.

Office Action mailed Apr. 25, 2017, issued in corresponding Chinese Application No. 201380002360.9, filed Sep. 24, 2013, with machine translation, 33 pages.

* cited by examiner

SEMICONDUCTOR DEVICE, OR CRYSTAL

TECHNICAL FIELD

The present invention relates to a semiconductor device or a crystal which is suitably used in power applications.

BACKGROUND ART

Promising next-generation switching devices capable of achieving high voltage, low loss, and high heat resistance include semiconductor devices which include silicon carbide (SiC) or gallium nitride (GaN), which has a large band gap. Such semiconductor devices are expected to be applied to power semiconductor devices, such as inverters.

In particular, as with silicon, SiC-MOSFETs having a MOS structure on the substrate surface have been developed as SiC-based, high-voltage semiconductor devices.

However, SiC and Ga semiconductor devices still have many problems to be solved. A significant one of the problems is that these semiconductor devices have difficulty in having a normally-off device structure.

Particularly, for SiC-MOSFETs, this problem has been found to arise from the fact that it is difficult to form an insulating film of good quality in the MOS structure. The reason is as follows: by paying much attention to formation of a semiconductor layer having good crystallinity, a semiconductor such as SiC which has been selected in view of its expected good crystallinity and good device characteristics, and thereafter an insulating film has been selected in view of its viability by techniques such as thermal oxidation, and the film forming process has been contemplated.

PRIOR ART DOCUMENTS

Patent Documents

[Patent Document 1] Japanese Unexamined Patent Application Publication No. 11-16900

Non-Patent Documents

[Non-Patent Document 1] Materials Science Forum, vols. 600-603, pp. 695-698

SUMMARY OF THE INVENTION

Problems to be Solved by the Invention

The present invention has been made in view of the foregoing, and an object thereof is to provide a semiconductor device including good insulating films.

Means for Solving the Problems

The present invention is a semiconductor device or a crystal including a base substrate, a semiconductor layer, and an insulating film each having a corundum crystal structure. Materials having a corundum crystal structure include many types of oxide films capable of functioning as an insulating film. Since all the base substrate, the semiconductor layer, and the insulating film have a corundum crystal structure, it is possible to achieve a semiconductor layer and an insulating film of good quality on the base substrate. The base substrate, the semiconductor layer, and the insulating film having a corundum crystal structure are formed through crystal growth by means of CVD or the like.

Achieving a normally-off semiconductor device requires forming an insulating film of good quality, as well as preventing accumulation of electrons between the insulating film and a film having a different composition during off. Materials having a corundum crystal structure are known to have extremely small polarization in a direction perpendicular to c-axis, such as the m-axis direction or a-axis direction. This prevents accumulation of electrons at the dissimilar material interfaces in the base substrate, the semiconductor layer, and the insulating film, as well as prevents leakage of the current when a lateral device is formed. This property is completely different from that of a GaN-based material where two-dimensional electron gases occurring at the dissimilar material interfaces are used.

Materials having a corundum crystal structure include sapphire ($Al_2O_3$), gallium oxide ($Ga_2O_3$), indium oxide ($In_2O_3$), chrome oxide ($Cr_2O_3$), ferric oxide ($Fe_2O_3$), titanium oxide ($Ti_2O_3$), vanadium oxide ($V_2O_3$), and cobalt oxide ($Co_2O_3$), as well as mixed crystals of two or more thereof.

When a semiconductor layer having the same composition as a base substrate is homoepitaxially grown, there occur no crystal defects resulting from a mismatch between the lattice constants. When a semiconductor layer having a lattice constant which differs from that of a base substrate by ±15% or less is epitaxially grown, crystal defects resulting from a mismatch between the lattice constants are less likely to occur. Some of materials having a corundum crystal structure have a relatively large band gap value. When such a material is used for a semiconductor layer and insulating film by controlling the impurity species and impurity concentration thereof, good properties can be achieved. When the difference in lattice constant is 5% or less, crystal defects resulting from a mismatch between the lattice constants are even less likely to occur.

For example, as shown in FIG. 1, an impurity-doped, α-phase aluminum gallium oxide film 2 represented by $Al_{X2}Ga_{Y2}O_3$ where $0≤X2≤2$, $0≤Y2≤2$, and $X2+Y2=1.5$ to $2.5$ and serving as a semiconductor layer is formed on an α-phase aluminum gallium oxide substrate 3 represented by $α-Al_{X1}Ga_{Y1}O_3$ where $0≤X1≤2$, $0≤Y1≤2$, and $X1+Y1=1.5$ to $2.5$, and an α-phase aluminum gallium oxide film 1 represented by $α-Al_{X3}Ga_{Y3}O_3$ and serving as an insulating film is formed on the semiconductor layer 2. Each X value must meet a condition that the difference in lattice constant is 15% or less. For example, each of X1, Y1, X2, Y2, X3, and Y3 is 0, 0.1, 0.2, 0.3, 0.4, 0.5, 0.6, 0.7, 0.8, 0.9, 1, 1.1, 1.2, 1.3, 1.4, 1.5, 1.6, 1.7, 1.8, 1.9, or 2, or may be a value in a range between any two of the values presented. For example, X+Y is 1.5, 1.6, 1.7, 1.8, 1.9, 2, 2.1, 2.2, 2.3, 2.4, or 2.5, or may be a value in a range between any two of the values presented.

A base substrate and a semiconductor layer, a semiconductor layer and an insulating film, or all a base substrate, a semiconductor layer, and an insulating film may be formed from different materials or compositions each having a corundum crystal structure.

For example, as shown in FIG. 2, a base substrate 6 may be formed from α-sapphire $Al_2O_3$; a semiconductor layer 5 from impurity-doped $α-In_{X1}Al_{Y1}Ga_{Z1}O_3$ where $0≤X1≤2$, $0≤Y1≤2$, $0≤Z1≤2$, and $X1+Y1+Z1=1.5$ to $2.5$; and an insulating film 4 from $α-Al_{X2}Ga_{Y2}O_3$ where $0≤X2≤2$, $0≤Y2≤2$, and $X2+Y2=1.5$ to $2.5$. Alternatively, the insulating film 4 may be formed from $α-In_{Z2}Al_{X2}Ga_{Y2}O_3$ where $0≤X2≤2$, $0≤Y2≤2$, $0≤Z2≤2$, and $X2+Y2+Z2=1.5$ to $2.5$.

For example, each of X1, Y1, Z1, X2, Y2, and Z2 is 0, 0.1, 0.2, 0.3, 0.4, 0.5, 0.6, 0.7, 0.8, 0.9, 1, 1.1, 1.2, 1.3, 1.4, 1.5, 1.6, 1.7, 1.8, 1.9, or 2, or may be a value in a range between any two of the values presented. For example, each of X1+Y1+Z1, X2+Y2, and X2+Y2+Z2 is 1.5, 1.6, 1.7, 1.8, 1.9, 2, 2.1, 2.2, 2.3, 2.4, or 2.5, or may be a value in a range between any two of the values presented. Only one of the three layers: the base substrate, the semiconductor layer, and the insulating film may be formed from a different material or composition. The base substrate 6 may also be any substrate having a corundum crystal structure.

Note that if the semiconductor layer 5 includes In or Ga, it is likely to function as a semiconductor. For this reason, it is preferable that $0.1 \leq X1$ or $0.1 \leq Z1$. To provide the semiconductor layer 5 with conductivity, the semiconductor layer 5 may be subjected to oxygen deficiency, oxygen excess, metal depletion, or metal excess rather than doped with impurities so as to form a donor level or acceptor level. In this case, $X1+Y1+Z1 \neq 2$. If the semiconductor layer 5 includes both In and Ga, it can be expected to obtain effects of increasing the carrier concentration and controlling mobility. For this reason, it is preferable that $0.1 \leq X1$ and $0.1 \leq Z1$. Each of X1, Y1, and Z1 is preferably 0.1 or more.

If the insulating film 4 includes predetermined amounts or more of Al and Ga, it is expected to have a high breakdown field, as well as has high affinity with the semiconductor layer including $\alpha\text{-In}_{X1}\text{Al}_{Y1}\text{Ga}_{Z1}\text{O}_3$. For this reason, in the above general formula, it is preferable that $0.1 \leq X2$ and $0.1 \leq Y2$. If Y2 indicating the Al content of the insulating film is greater than Y1 indicating the Al content of the semiconductor layer, the following advantage is obtained: the insulating film has a larger band gap than the semiconductor layer, and even when a voltage is applied to a gate electrode formed on the insulating film, carriers do not move to or accumulate in the insulating film and thus accumulation of carriers at the semiconductor-insulating film interface is assisted. For this reason, it is preferable that $Y2 > Y1$.

The above description also applies to the base substrates, the semiconductor layers, and the insulating films described in the other portions of the present specification.

If a base substrate and a semiconductor layer are formed from different materials each having a corundum crystal structure, a crystalline stress relaxation layer having a corundum crystal structure may be formed as an intermediate layer. The crystalline stress relaxation layer is useful to reduce stress which occurs at the interface between the different materials and to favorably maintain the crystal quality of the interface and the layers. Further, if the base substrate includes unexpected current paths, the crystalline stress relaxation layer may show an effect of reducing current leakage from the base substrate. Typically, a buffer layer between a base substrate and a semiconductor layer is a low-crystal-quality film, which is grown at low temperature. On the other hand, the crystalline stress relaxation layer is characterized in that it does not significantly differ in crystallinity from the semiconductor layer or base substrate. In contrast, a typical buffer layer has a different crystal structure.

For example, as shown in FIG. 3, it is possible to use $\alpha$-sapphire ($\text{Al}_2\text{O}_3$) as a base substrate 10, to form a crystalline stress relaxation layer 9 from $\alpha\text{-Al}_{X1}\text{Ga}_{Y1}\text{O}_3$ where $0 \leq X1 \leq 2$, $0 \leq Y1 \leq 2$, and $X1+Y1=1.5$ to 2.5 and where the amount of Al is gradually reduced, then to form a semiconductor layer 8 from impurity-doped, $\alpha\text{-In}_{X2}\text{Al}_{Y2}\text{Ga}_{Z2}\text{O}_3$ where $0 \leq X2 \leq 2$, $0 \leq Y2 \leq 2$, $0 \leq Z2 \leq 2$, and $X2+Y2+Z2=1.5$ to 2.5, and to form an insulating film 7 from $\alpha\text{-Al}_{X3}\text{Ga}_{Y3}\text{O}_3$ where $0 \leq X3 \leq 2$, $0 \leq Y3 \leq 2$, and $X3+Y3=1.5$ to 2.5.

The total number of the dissimilar materials of the crystalline stress relaxation layer may be one or more. For example, each of X1, Y1, X2, Y2, Z2, X3, and Y3 is 0, 0.1, 0.2, 0.3, 0.4, 0.5, 0.6, 0.7, 0.8, 0.9, 1, 1.1, 1.2, 1.3, 1.4, 1.5, 1.6, 1.7, 1.8, 1.9, or 2, or may be a value in a range between any two of the values presented. For example, each of X1+Y1, X2+Y2+Z2, and X3+Y3 is 1.5, 1.6, 1.7, 1.8, 1.9, 2, 2.1, 2.2, 2.3, 2.4, or 2.5, or may be a value in a range between any two of the values presented.

If a semiconductor layer and an insulating film are formed from different materials each having a corundum crystal structure, a cap layer having a corundum crystal structure may be formed between the semiconductor layer and the insulating film. Unlike a buffer layer formed between a base substrate and a semiconductor layer, the cap layer is characterized in that it is formed between the semiconductor layer and the insulating film. If the semiconductor device is used as a power semiconductor device, it is preferred to reduce the thickness of the insulating film so that the insulating film can efficiently transmit a field generated by a voltage applied to a metal formed on an upper portion of the insulating film. Doing so reduces stress which occurs due to a mismatch between the lattice constants at the interface between the semiconductor layer and the insulating film. This eliminates the need to relax stress. Further, it has not been expected that a corundum crystal film of good quality would be achieved by paying attention to the crystal structure of an insulating film and thus forming an insulating film having the same crystal structure as a semiconductor layer. Accordingly, an insulating film and an intermediate layer between the insulating film and a semiconductor layer have not been expected to have a stress relaxation effect and an effect of favorably maintaining crystal quality that a cap layer is expected to have. Accordingly, no cap layer has not been formed as an intermediate layer between a semiconductor layer and an insulating film.

In the present invention, the cap layer has an effect of improving the reliability of the corundum crystal film. The cap layer can also reduce current paths which occur between the semiconductor layer and the insulating film. Further, the cap layer can reduce small holes in the corundum crystal film and therefore prevent entry of external impurities such as hydrogen atoms. Furthermore, the cap layer has an effect of making smaller a minuscule electron accumulation between the insulating film and the semiconductor layer, resulting from small polarization of the insulating film and the semiconductor layer and thus has an effect of achieving a normally-off semiconductor device.

For example, as shown in FIG. 4, it is possible to use $\alpha$-sapphire ($\text{Al}_2\text{O}_3$) as a base substrate 15, to form a crystalline stress relaxation layer 14 from $\alpha\text{-Al}_{X1}\text{Ga}_{Y1}\text{O}_3$ where $0 \leq X1 \leq 2$, $0 \leq Y1 \leq 2$, and $X1+Y1=1.5$ to 2.5 and where the amount of Al is gradually reduced, then to form a semiconductor layer 13 from impurity-doped $\alpha\text{-In}_{X2}\text{Al}_{Y2}\text{Ga}_{Z2}\text{O}_3$ where $0 \leq X2 \leq 2$, $0 \leq Y2 \leq 2$, $0 \leq Z2 \leq 2$, and $X2+Y2+Z2=1.5$ to 2.5, to form a cap layer 12 from $\alpha\text{-Al}_{X3}\text{Ga}_{Y3}\text{O}_3$ where $0 \leq X3 \leq 2$, $0 \leq Y3 \leq 2$, and $X3+Y3=1.5$ to 2.5 and where the amount of Al is gradually increased, and to form an insulating film 11 from $\alpha\text{-Al}_{X4}\text{Ga}_{Y4}\text{O}_3$ where $0 \leq X4 \leq 2$, $0 \leq Y4 \leq 2$, and $X4+Y4=1.5$ to 2.5. The total number of the dissimilar materials of each of the crystalline stress relaxation layer and the cap layer may be one or more. For example, each of X1, Y1, X2, Y2, Z2, X3, Y3, X4, and Y4 is 0, 0.1, 0.2, 0.3, 0.4, 0.5, 0.6, 0.7, 0.8, 0.9, 1, 1.1, 1.2, 1.3, 1.4, 1.5, 1.6, 1.7, 1.8, 1.9, or 2, or may be a value in a range between any two of the values presented. For example, each of X1+Y1, X2+Y2+Z2, X3+Y3, and X4+Y4 is 1.5, 1.6, 1.7, 1.8, 1.9, 2, 2.1, 2.2, 2.3, 2.4, or 2.5, or may be a value in a range between any two of the values presented.

If a base substrate and a semiconductor layer, or a semiconductor layer and an insulating film are formed from different materials each having a corundum crystal structure, a structural phase transition prevention layer having a corundum crystal structure may be formed between the semiconductor layer and the insulating film, between the base substrate and the semiconductor layer, between a crystalline stress relaxation layer and the semiconductor layer, or between a cap layer and the insulating film. If the crystal growth temperature at which the crystalline stress relaxation layer, the semiconductor layer, the cap layer, or the insulating film is formed is higher than the crystal structure transition temperature of the underlying layer, the corundum crystal structure can be prevented from changing to a different crystal structure by forming a structural phase transition prevention layer. On the other hand, if the formation temperature of the crystalline stress relaxation layer, the semiconductor layer, the cap layer, or the insulating film is reduced to prevent a phase transition from the corundum crystal structure to a different one, the crystallinity thereof would be reduced. Thus, it is difficult to prevent change of the crystal structure by reducing the film forming temperature. For this reason, the formation of a structural phase transition prevention layer is useful.

For example, as shown in FIG. 5, it is possible to form a semiconductor layer 18 from $In_{X1}Al_{Y1}Ga_{Z1}O_3$ where $0 \leq X1 \leq 2$, $0 \leq Y1 \leq 2$, $0 \leq Z1 \leq 2$, and $X1+Y1+Z1=1.5$ to 2.5, to form a structural phase transition prevention layer 17 from $Al_{X2}Ga_{Y2}O_3$ where $0 \leq X2 \leq 2$, $0 \leq Y2 \leq 2$, and $X2+Y2=1.5$ to 2.5, and to form an insulating film 16 from $Al_{X3}Ga_{Y3}O_3$ where $0 \leq X3 \leq 2$, $0 \leq Y3 \leq 2$, and $X3+Y3=1.5$ to 2.5. In this case, the Al content (X2 value) of the structural phase transition prevention layer 17 is greater than the Al content (Y1 value) of the semiconductor layer 18 and smaller than the Al content (X3 value) of the insulating film 16. The total number of the dissimilar materials of the structural phase transition prevention layer may be one or more. For example, each of X1, Y1, Z1, X2, Y2, Z2, X3, and Y3 is 0, 0.1, 0.2, 0.3, 0.4, 0.5, 0.6, 0.7, 0.8, 0.9, 1, 1.1, 1.2, 1.3, 1.4, 1.5, 1.6, 1.7, 1.8, 1.9, or 2, or may be a value in a range between any two of the values presented. For example, each of X1+Y1+Z1, X2+Y2, and X3+Y3 is 1.5, 1.6, 1.7, 1.8, 1.9, 2, 2.1, 2.2, 2.3, 2.4, or 2.5, or may be a value in a range between any two of the values presented.

A method for manufacturing a semiconductor device or a crystal described above includes, for example, a step of providing a raw material mist to a film forming chamber, the raw material mist being generated by atomizing a raw material solution, the raw material solution being obtained by dissolving, in a solvent, a solute which is a raw material for the semiconductor layer and the insulating film, but not limited thereto. Preferably, the method includes a step of making the raw material mist react in the film forming chamber to form the semiconductor layer and the insulating film on the base substrate. Preferably, at least one of the semiconductor layer and the insulating film includes a mixed crystal film, and the mixed crystal film is formed from a raw material solution obtained by dissolving two or more solutes in a solvent. Preferably, at least one of the semiconductor layer and the insulating film includes a mixed crystal film, and the mixed crystal film is formed by simultaneously injecting raw material mists into a film forming chamber, the raw material mists being obtained by atomizing two or more raw material solutions separately.

A semiconductor device including a semiconductor layer and an insulating film which are corundum crystals and a support substrate which is not a corundum crystal may be formed by the following method. That is, all layers, including a base substrate, the semiconductor layer, and the insulating film, are formed from corundum crystals; then the support substrate is bonded to the surface remote from the base substrate; then the base substrate is subjected to processes such as hydrogen ion implantation or heating and then peeled off. This method includes a crystal forming step of forming a semiconductor layer and an insulating film on a base substrate in this order or in an order reverse to this order, a bonding step of bonding a support substrate to the surface remote from the base substrate, and a peeling step of peeling off the base substrate. All the base substrate, the semiconductor layer, and the insulating film have a corundum crystal structure. Preferably, the support substrate is one of a SiC substrate, a Si substrate, a metal substrate, a ceramic substrate, and a glass substrate. Preferably, the support substrate is bonded, via a joining layer, to the surface remote from the base substrate. Preferably, the joining layer is formed from a silicon oxide film.

Since the above method uses, as a support substrate, a substrate which is not a corundum crystal, it is possible to use a substrate having a higher heat dissipation effect or to reduce the substrate cost. It is also possible to change the film formation order, for example, by forming an insulating film on a base substrate and then forming a semiconductor layer on the insulating film. Thus, it is possible to simplify the device process steps, such as ion implantation, etching, and photolithography,

EMBODIMENTS

Figure 1:
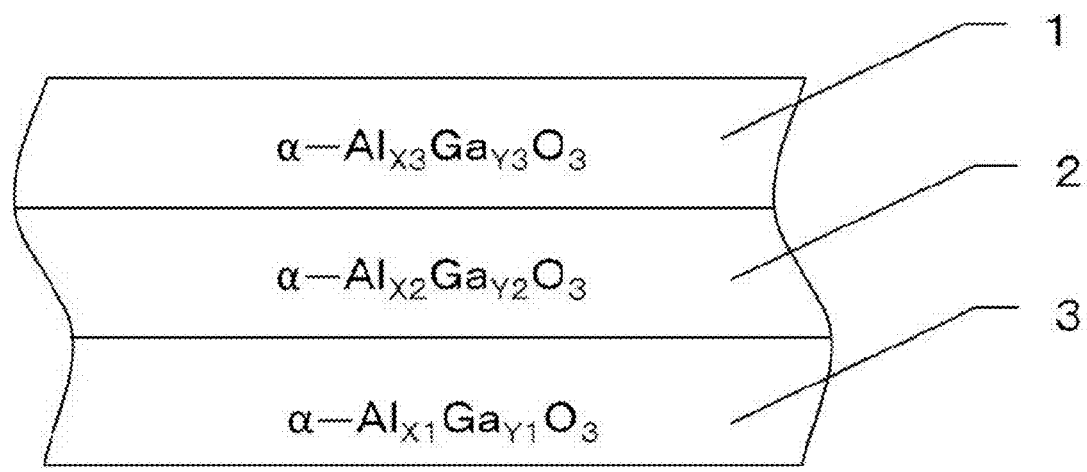
FIG. 1 is a sectional view of a semiconductor device showing an example of an embodiment of the present invention.
Figure 2:
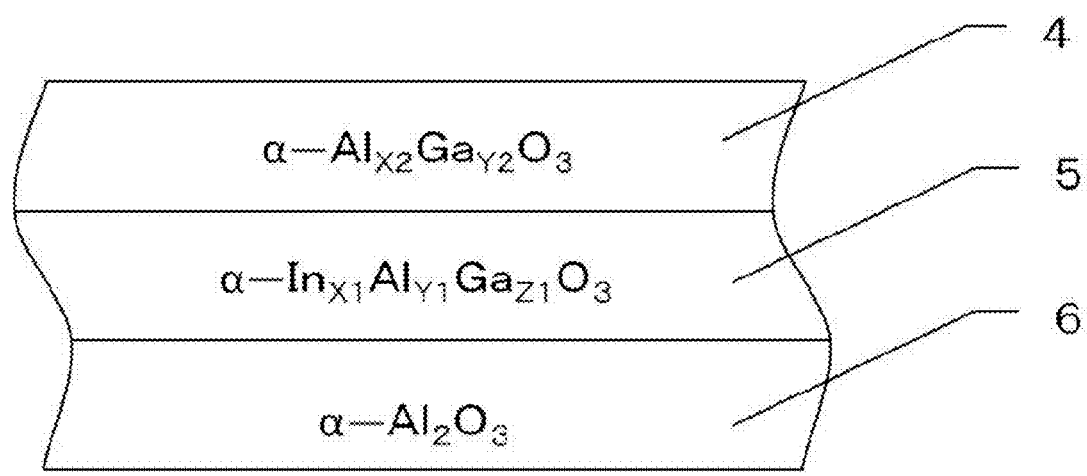
FIG. 2 is a sectional view of a semiconductor device showing another example of the embodiment of the present invention.
Figure 3:
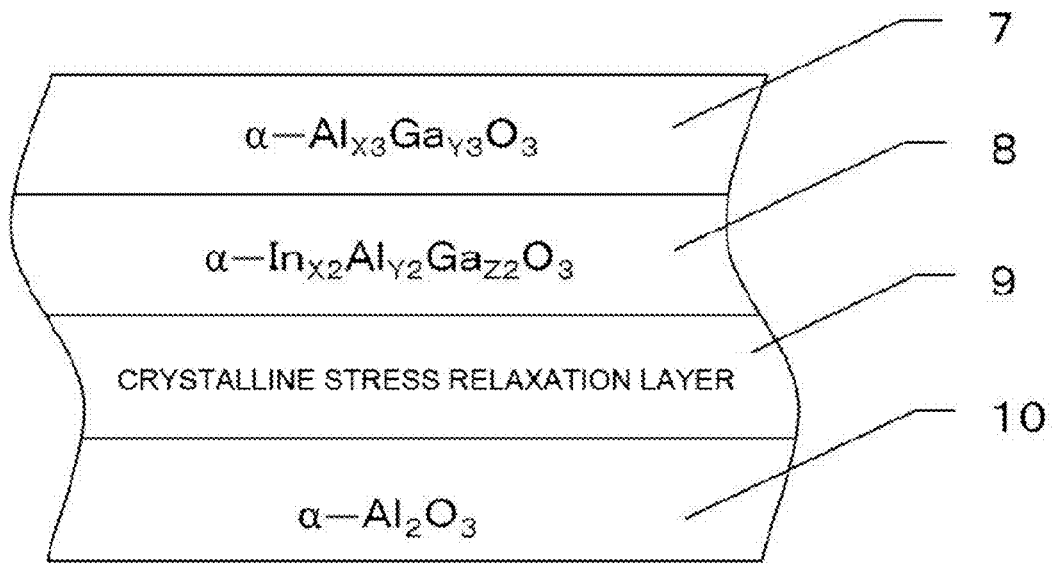
FIG. 3 is a sectional view of a semiconductor device showing another example of the embodiment of the present invention.
Figure 4:
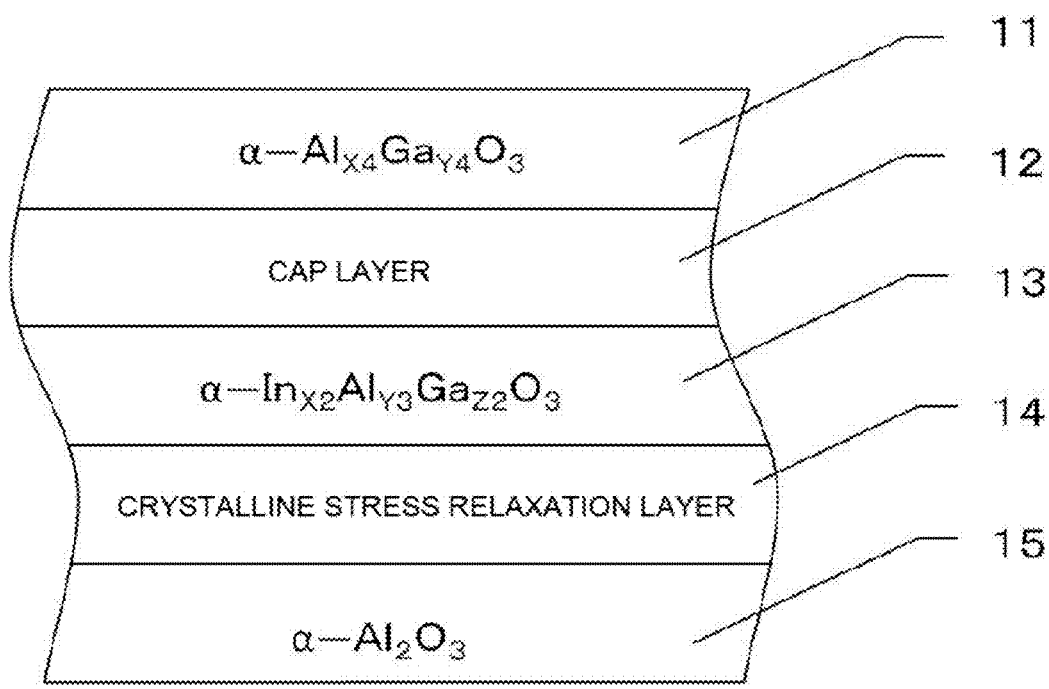
FIG. 4 is a sectional view of a semiconductor device showing another example of the embodiment of the present invention.
Figure 5:
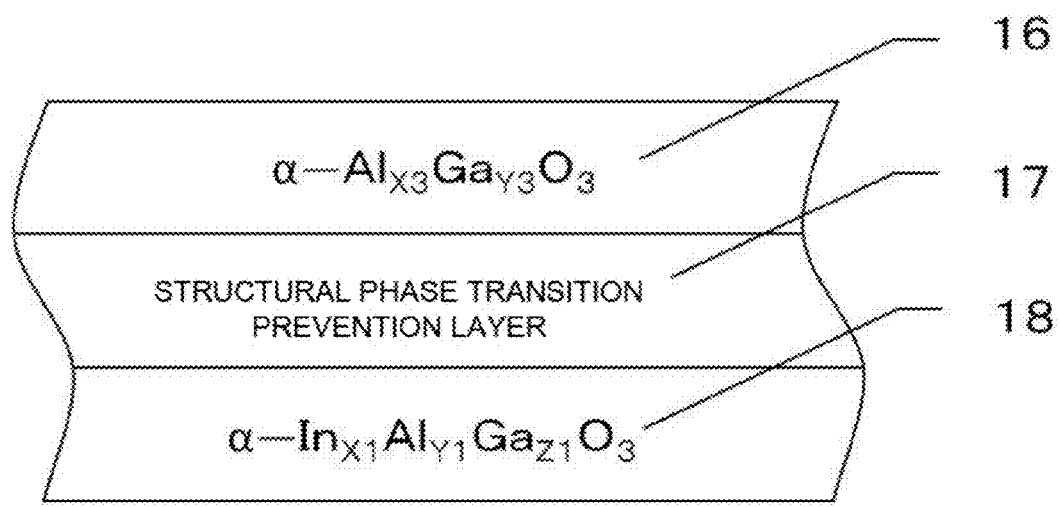
FIG. 5 is a sectional view of a semiconductor device showing another example of the embodiment of the present invention.

Now, a preferred embodiment of a semiconductor device and a manufacturing method thereof according to the present invention will be described with reference to the accompanying drawings. Through the drawings, components having the same reference numerals are the same components.
[Method for Manufacturing Semiconductor Device, Corundum Crystal Film Forming Apparatus]

There will be described a method for manufacturing a semiconductor device and a film forming apparatus 10A used to form corundum crystal films.

Figure 6:
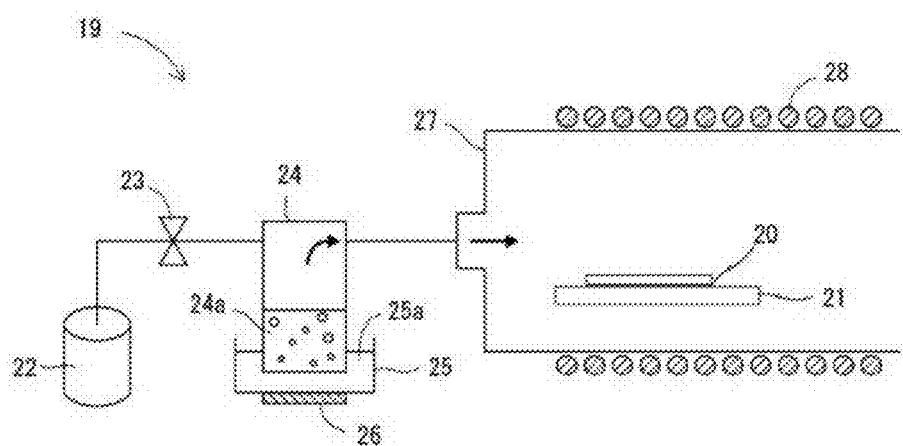
FIG. 6 is a configuration diagram of a film forming apparatus showing an example of the embodiment of the present invention.

A film forming apparatus 19 shown in FIG. 6 is a mist CVD apparatus and is configured as follows. That is, the film forming apparatus 19 includes a sample 20 on which films are to be formed, such as a base substrate, a sample stage 21, a nitrogen source 22, a flow rate control valve 23 for controlling the flow rate of nitrogen sent from the nitrogen source 22, a mist source 24 including a solution 24a, a container 25 containing water 25a, an ultrasonic transducer 26 attached to the bottom of the container 25, a film forming chamber 27 formed of a quartz tube, a metal such as stainless steel, or ceramic such as alumina, and a heater 28 adjacent to or under the film forming chamber 27.

In the formation of a corundum crystal film, first, the temperature of the film forming chamber 27 is raised to a predetermined temperature (e.g., 300 to 550° C.) by the heater 28. Subsequently, the sample 20, such as a base substrate, is placed on the sample stage 21 in the film forming chamber 27.

After the sample 20 is placed, a nitrogen gas which is previously sent from the nitrogen source 22 substitutes for a sufficient amount of atmosphere inside the film forming chamber. Subsequently, the ultrasonic transducer 26 starts vibrating. When the ultrasonic transducer 26 vibrates at a predetermined frequency (e.g., 2.4 MHz), the vibration propagates to the solution 24a through the water 25a, generating a mist from the solution 24a. The generated mist is pushed out by the nitrogen sent from the nitrogen source 22, and injected into the film forming chamber 27, whose temperature has been raised.

The mist, injected into the film forming chamber 27, is decomposed at high temperature and reaches a surface of the sample 20 on which corundum crystal films are to be formed. Subsequently, a CVD reaction occurs on the surface of the sample 20, forming a corundum crystal film. As a result, at least part of the surface, which the mist has reached, is covered by the corundum crystal film. For example, if the solution 24a includes gallium acetylacetonate serving as a solute and extra-pure water serving as a solvent, a gallium oxide film is formed. In addition to the above film, the film forming apparatus 19 can form corundum crystal films shown in a table below.

[Corundum Crystal Materials and Compositions]

Table 1 shows an example of the types of crystal films used as a base substrate, a semiconductor layer, and an insulating film each having a corundum crystal structure.

TABLE 1

| Corundum Crystal Film | Solute | Solvent |
|---|---|---|
| titanium oxide | titanium acetylacetonate | methanol (95%) + extra-pure water (5%) |
| gallium oxide | gallium acetylacetonate | extra-pure water |
| ferric oxide | ferric acetylacetonate | extra-pure water |
| chrome oxide | chrome acetylacetonate | extra-pure water, methanol (95%) + extra-pure water (5%) |
| aluminum oxide | aluminum acetylacetonate | extra-pure water |
| indium oxide | indium acetylacetonate | extra-pure water |
| tin oxide | tin chloride | extra-pure water |

TABLE 1-continued

| Corundum Crystal Film | Solute | Solvent |
|---|---|---|
| vanadium oxide | vanadium acetylacetonate | methanol (95%) + extra-pure water (5%) |
| cobalt oxide | cobalt acetylacetonate | methanol (95%) + extra-pure water (5%) |

Corundum crystal films used as a base substrate, a semiconductor layer, and an insulating film may be single-composition films or mixed crystal films. To form a mixed crystal film, it is only necessary to generate a mist from a solution 13a where two or more solutes are mixed or to simultaneously inject, into the film forming chamber 27, two or more mists which have been generated separately.

[Extraction]

After the corundum crystal films are formed, the base substrate having the corundum crystal films formed thereon is extracted from the film forming chamber 16. In this way, the film forming process of the semiconductor device of the present invention is performed. Subsequently, the formed films are subjected to device processes, such as ion implantation, etching, and photolithography.

[Film Structure]

Figure 7:
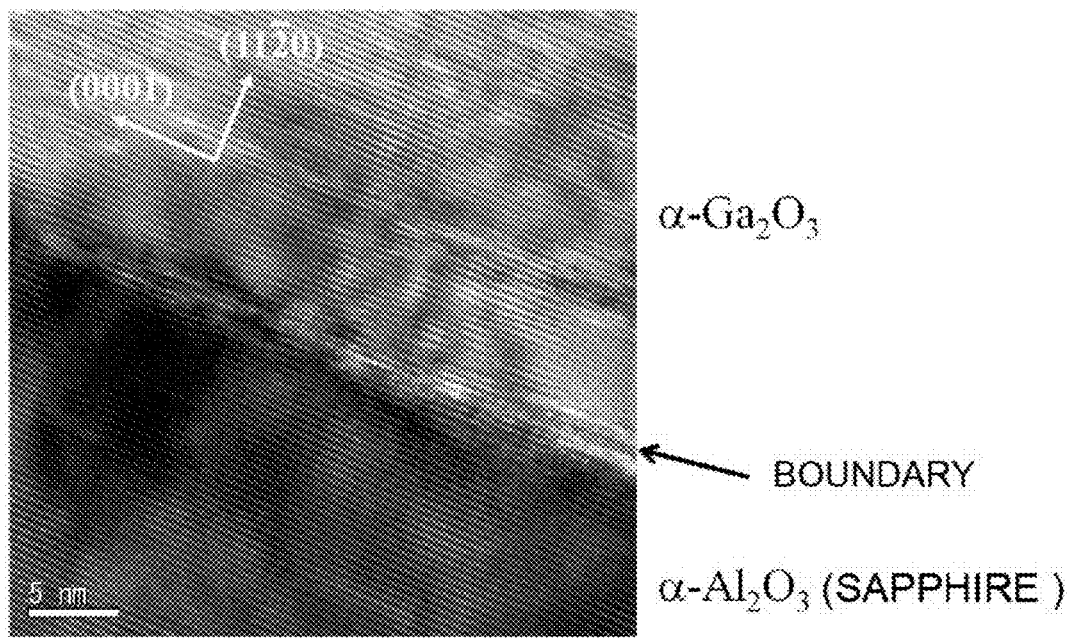
FIG. 7 is a microscope photograph showing an example of a TEM image of the embodiment of the present invention.
Figure 8:
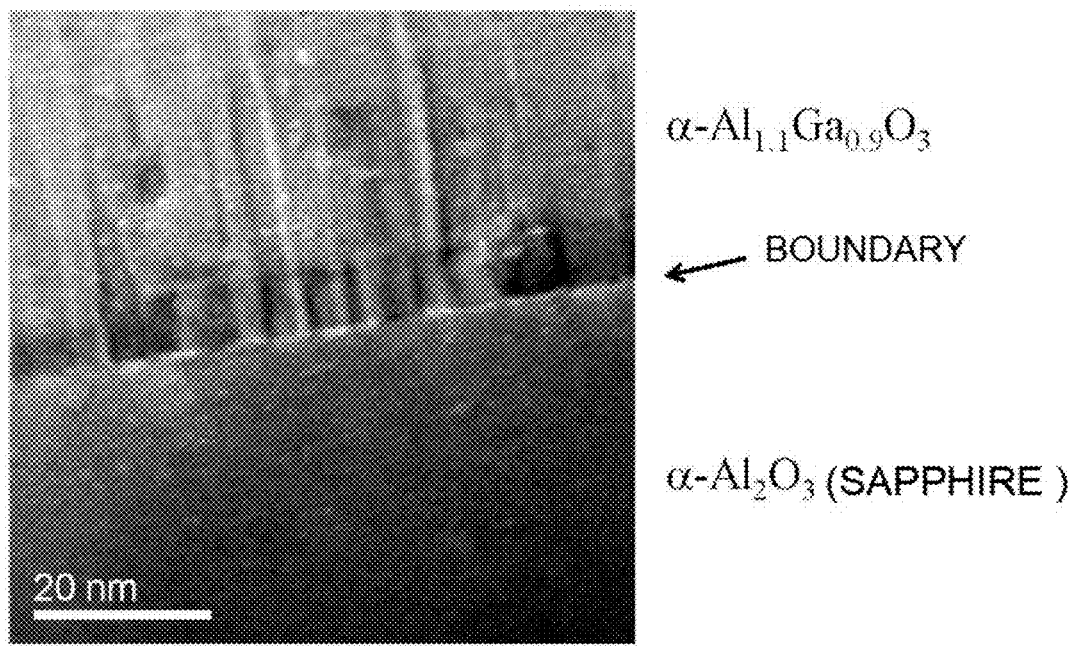
FIG. 8 is a microscope photograph showing another example of a TEM image of the embodiment of the present invention.
Figure 9:
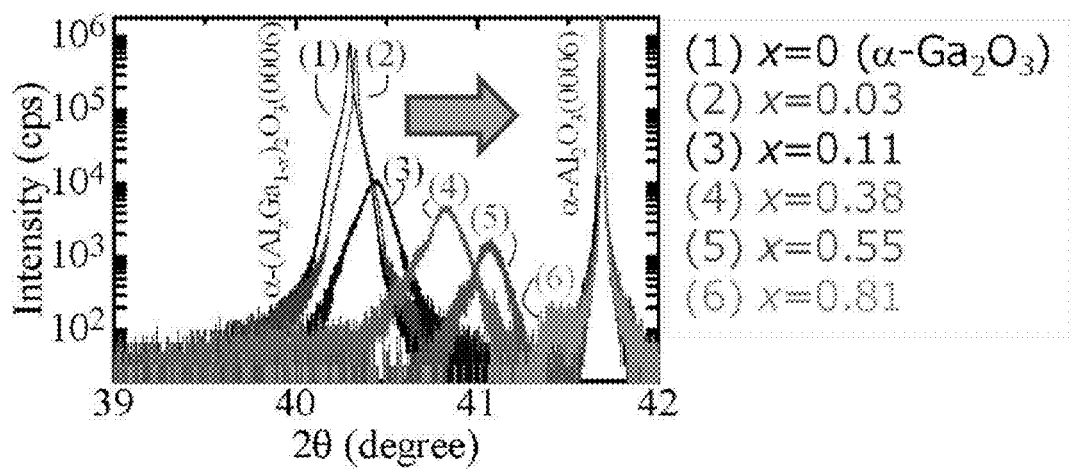
FIG. 9 is a diagram showing an example of an X-ray diffraction profile of the embodiment of the present invention.
Figure 10:
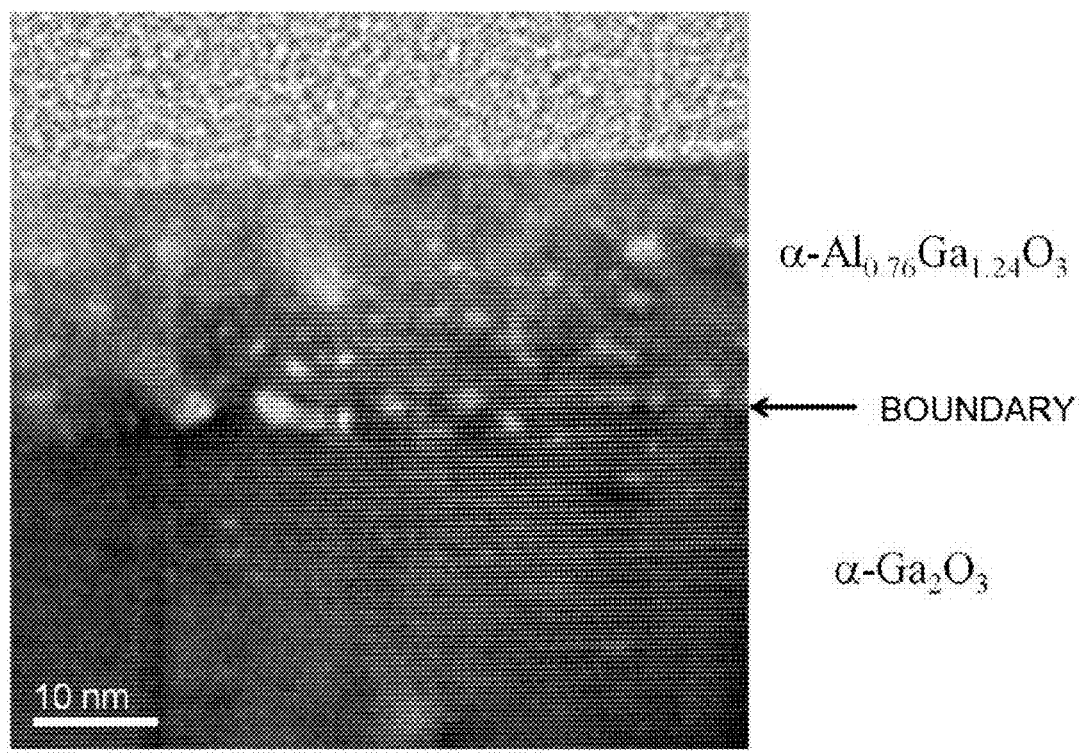
FIG. 10 is a microscope photograph showing another example of a TEM image of the embodiment of the present invention.

FIGS. 7 and 8 are TEM images showing an α-gallium oxide ($Ga_2O_3$) film (FIG. 7) and an α-$Al_{1.1}Ga_{0.9}O_3$ film (Al=55%) serving as semiconductor layers formed on α-sapphire ($Al_2O_3$) serving as a base substrate by a film forming apparatus 10C by means of the mist CVD method. A film having any composition α-$In_XAl_YGa_ZO_3$ where $0 \leq X \leq 2$, $0 \leq Y \leq 2$, $0 \leq Z \leq 2$, and $X+Y+Z=1.5$ to $2.5$ and serving as a semiconductor layer may be formed on the α-sapphire substrate. FIG. 9 shows an example of an X-ray diffraction result of the formed semiconductor layer. After forming the semiconductor layer having any composition α-$In_XAl_YGa_ZO_3$ where $0 \leq X \leq 2$, $0 \leq Y \leq 2$, $0 \leq Z \leq 2$, and $X+Y+Z=1.5$ to $2.5$ on the α-sapphire substrate, an insulating film having any composition α-$Al_XGa_YO_3$ where $0 \leq X \leq 2$, $0 \leq Y \leq 2$, and $X+Y+Z=1.5$ to $2.5$ may be further formed. FIG. 10 is a TEM image showing an example of the insulating film α-$Al_{0.76}Ga_{1.44}O_3$ (Al=38%), which is further formed on the semiconductor layer, α-gallium oxide ($Ga_2O_3$).

Various types of materials or compositions may be used to form a base substrate, a semiconductor layer, and an insulating film as long as the films have a corundum crystal structure. Further, any materials shown in Table 1 or mixed crystals thereof may be used to form films having a corundum crystal structure.

All the base substrate, semiconductor layer, and insulating film may be the same films, or each film may be formed from a semiconductor material or composition having a lattice constant which differs from that of the layer underlying the film by 15% or less.

A layer(s) formed from a different material or composition may be disposed among the base substrate, the semiconductor layer, and the insulating film each having a corundum crystal structure. For example, a crystalline stress relaxation layer having a corundum crystal structure may be formed between the base substrate and the semiconductor layer, or a cap layer or structural phase transition prevention layer having a corundum crystal structure may be formed between the semiconductor layer and the insulating film. Two or more of a crystalline stress relaxation layer, a cap layer, and a structural phase transition prevention layer may be formed in combination. Further, corundum crystal films used as a base substrate, a semiconductor layer, and an insulating film may each have a multilayer structure where multiple single-composition films or multiple mixed crystal films are layered. If each corundum crystal films has a multilayer structure, it is possible to improve crystallinity, increase the current, or improve reliability.

If the semiconductor layer is any composition $\alpha\text{-}In_XAl_YGa_ZO_3$ where $0 \leq X \leq 2$, $0 \leq Y \leq 2$, $0 \leq Z \leq 2$, and $X+Y+Z=1.5$ to $2.5$, the base substrate may be an $\alpha$-sapphire ($Al_2O_3$) substrate or $\alpha\text{-}Ga_2O_3$ substrate, and the insulating film may be formed from $\alpha\text{-}Al_{0.76}Ga_{1.44}O_3$ (Al=38%). In this case, a crystalline stress relaxation layer having a corundum crystal structure and one or more layers may be formed from $\alpha\text{-}Al_XGa_YO_3$ where $0 \leq X \leq 2$, $0 \leq Y \leq 2$, and $X+Y=1.5$ to $2.5$ and where the amount of Al is gradually reduced if the base substrate is an $\alpha$-sapphire substrate or formed from $\alpha\text{-}Al_XGa_YO_3$ film where $0 \leq X \leq 2$, $0 \leq Y \leq 2$, and $X+Y=1.5$ to $2.5$ and where the amount of Al is gradually increased if the base substrate is an $\alpha\text{-}Ga_2O_3$ substrate. A cap layer or structural phase transition prevention layer including one or more layers may be formed from $\alpha\text{-}Al_XGa_YO_3$ where $0 \leq X \leq 2$, $0 \leq Y \leq 2$, and $X+Y=1.5$ to $2.5$ and where the amount of Al is gradually increased. The crystalline stress relaxation layer and the cap layer can be expected to show an effect of reducing various types of dislocation, such as edge dislocation, screw dislocation, or basal plane dislocation, resulting from the difference in lattice constant between the $\alpha$-sapphire substrate and the semiconductor layer and between the semiconductor layer and the insulating film, respectively.

For example, a structural phase transition prevention layer may be formed as follows. If a semiconductor layer is formed from $\alpha\text{-}Ga_2O_3$ on an $\alpha$-sapphire base substrate and then an insulating film is formed, on the $\alpha\text{-}Ga_2O_3$ film, from $\alpha\text{-}Al_XGa_YO_3$ where $0 \leq X \leq 2$, $0 \leq Y \leq 2$, and $X+Y=1.5$ to $2.5$ and which has good crystallinity, a cap layer is formed from $\alpha\text{-}Al_XGa_YO_3$ ($0 \leq X \leq 2$, $0 \leq Y \leq 2$, $X+Y=1.5$ to $2.5$ and which has a smaller Al composition ratio than the insulating film between the semiconductor layer and the insulating film. The crystalline growth temperature of the $\alpha\text{-}Al_XGa_YO_3$ ($0 \leq X \leq 2$, $0 \leq Y \leq 2$, $X+Y=1.5$ to $2.5$) film may be set to 500° C. or less. However, when the Al composition ratio is large, it is possible to form a film having better crystallinity by setting the crystalline growth temperature to 530° C. or more. On the other hand, when the film forming temperature is 530° C. or more and when an insulating film is formed without a cap layer, there is an experience that parts of the semiconductor layer and insulating film were subjected to a transition to β phase. So, a cap layer is formed from $\alpha\text{-}Al_XGa_YO_3$ where $0 \leq X \leq 2$, $0 \leq Y \leq 2$, and $X+Y=1.5$ to $2.5$ and which has a smaller Al composition than an insulating film, at a temperature of 500° C. or less, and then an insulating film is formed from $\alpha\text{-}Al_XGa_YO_3$ where $0 \leq X \leq 2$, $0 \leq Y \leq 2$, and $X+Y=1.5$ to $2.5$ and which has a larger Al composition than the cap layer, at a temperature of 530° C. or more.

The base substrate, the semiconductor layer, and the insulating film may be formed in this order, or may be formed in the order of the base substrate, the insulating film, and the semiconductor layer. Thus, in the semiconductor device or the crystal of the present invention, the semiconductor layer and the insulating film are disposed on the base substrate in this order or in an order reverse to this order, and all the base substrate, the semiconductor layer, and the insulating film have a corundum crystal structure.

After forming all or some of the base substrate, the semiconductor layer, and the insulating film each having a corundum crystal structure, the base substrate may be peeled off and then the remaining films may be fixed to a separate support substrate. For example, the following steps may be used. First, an insulating film is formed from $\alpha\text{-}Al_XGa_YO_3$ where $0 \leq X \leq 2$, $0 \leq Y \leq 2$, and $X+Y=1.5$ to $2.5$ on an $\alpha$-sapphire $Al_2O_3$ substrate; then a semiconductor layer having any composition $\alpha\text{-}In_XAl_YGa_ZO_3$ where $0 \leq X \leq 2$, $0 \leq Y \leq 2$, $0 \leq Z \leq 2$, and $X+Y+Z=1.5$ to $2.5$ is formed; and then a silicon oxide film is formed on the semiconductor layer. A separate support substrate obtained by forming a silicon oxide film on a SiC substrate or Si substrate is prepared and joined to the silicon oxide film on the semiconductor layer. Subsequently, the base substrate is peeled off. These silicon films function as joining layers. The peel-off of the base substrate may be performed through implantation of ions, such as hydrogen ions, a heating/cooling process, or plasma processing, or using a method, such as etching, at any timing after forming the silicon oxide film on the semiconductor layer. The base substrate may be any metal oxide film having a corundum crystal structure included in Table 1. The support substrate may be a semiconductor substrate formed from Si, SiC, GaAs, or GaN, a ceramic film, a metal substrate, a glass substrate, or the like. A layer(s) may be formed from a different material or composition among the base substrate, the semiconductor layer, and the insulating film each having a corundum crystal structure. For example, a crystalline stress relaxation layer having a corundum crystal structure may be formed between the base substrate and the semiconductor layer, and/or a cap layer or structural phase transition prevention layer may be formed between the semiconductor layer and the insulating film. Two or more of a crystalline stress relaxation layer, a cap layer, and a structural phase transition prevention layer may be formed in combination. After bonding the base substrate, the surface of the corundum crystal may be polished using a method, such as CMP, to improve the crystallinity of the surface. At this time, part or all of the crystalline stress relaxation layer, cap layer, or structural phase transition prevention layer may be eliminated.

The present invention is not limited to the above embodiment, and various modifications are conceivable. For example, the film forming method using mist CVD may be the fine channel method, in which a channel of several mm or less is used as a reaction area, the linear source method, in which a linear nozzle is disposed on a substrate, a mist (and a carrier gas) is perpendicularly sprayed on the substrate from the nozzle, and the nozzle is moved in a direction perpendicular to a linear outlet, or combinations or derivatives of multiple methods. The fine channel method allows formation of uniform thin films and improvements in the utilization efficiency of the raw material, while the linear source method allows continuous film formation on a future large-area substrate and by roll-to-roll. The carrier gas may be a gas, such as argon, oxygen, ozone, or air, rather than nitrogen. The pressure in the film forming chamber may be increased or reduced.

While the corundum crystal films are formed by the mist CVD method in the above embodiment, other methods may be used. Other techniques capable of forming corundum crystal films include Metal-Organic Chemical Vapor Deposition, and Molecular Beam Epitaxy, and so on.

In the present invention, the base substrate, the semiconductor layer, the insulating film, the crystalline stress relaxation layer, the cap layer, and the structural phase transition prevention layer each having a corundum crystal structure may be doped with an element (e.g., tin, silicon, or magnesium which is suitable for a corundum crystal film). Thus, conductivity and insulation properties can be adjusted.

Further, in the present invention, a repeated structure with respect to the film composition and the doped element concentration may be introduced to part of the semiconductor film, the insulating film, the crystalline stress relaxation layer, the cap layer, and/or the structural phase transition prevention layer each having a corundum crystal structure. This makes it possible to facilitate relaxation of stress, reduce or increase the carrier concentration, or adjust the carrier mobility.

DESCRIPTION OF NUMERALS 1 insulating film
2 semiconductor layer
3 base substrate
4 insulating film
5 semiconductor layer
6 base substrate
7 insulating film
8 semiconductor layer
9 crystalline stress relaxation layer
10 base substrate
11 insulating film
12 cap layer
13 semiconductor layer
14 crystalline stress relaxation layer
15 base substrate
16 insulating film
17 structural phase transition prevention layer
18 semiconductor layer
19 film forming apparatus
20 sample on which films are to be formed
21 sample stage
22 nitrogen source
23 flow rate control valve
24 mist source
24a solution
25 mist source
25a water
26 ultrasonic transducer
27 film forming chamber
28 heater

The invention claimed is:

1. A semiconductor device or a crystal comprising:
  a base substrate;
  a semiconductor layer; and
  an insulating film, wherein:
    the semiconductor layer and the insulating film are disposed on the base substrate in this order or in an order reverse to this order, and
    all the base substrate, the semiconductor layer, and the insulating film have a corundum crystal structure.

2. The semiconductor device or the crystal of claim 1, wherein all the base substrate, the semiconductor layer, and the insulating film are formed from one of sapphire, gallium oxide, indium oxide, chrome oxide, ferric oxide, titanium oxide, vanadium oxide, and cobalt oxide, or a mixed crystal of two or more thereof.

3. The semiconductor device or the crystal of claim 1, wherein all the base substrate, the semiconductor layer, and the insulating film are formed from the same semiconductor material or composition, or semiconductor materials or compositions having lattice constants which differ from each other by 15% or less.

4. The semiconductor device or the crystal of claim 3, wherein all the base substrate, the semiconductor layer, and the insulating film are formed from α-phase aluminum gallium oxide represented by $Al_XGa_YO_3$ where $0 \leq X \leq 2$, $0 \leq Y \leq 2$, and $X+Y=1.5$ to $2.5$.

5. The semiconductor device or the crystal of claim 1, wherein
  at least one of the base substrate, the semiconductor layer, and the insulating film has a different composition.

6. The semiconductor device or the crystal of claim 1, wherein
  the base substrate and the insulating film are formed from one of sapphire, gallium oxide, indium oxide, chrome oxide, ferric oxide, titanium oxide, vanadium oxide, and cobalt oxide, or a mixed crystal of two or more thereof, and
  the semiconductor layer is formed from $\alpha\text{-}In_{X1}Al_{Y1}Ga_{Z1}O_3$ where $0 \leq X1 \leq 2$, $0 \leq Y1 \leq 2$, $0 \leq Z1 \leq 2$, and $X1+Y1+Z1=1.5$ to $2.5$.

7. The semiconductor device or the crystal of claim 6, wherein $0.1 \leq X1$ or $0.1 \leq Z1$.

8. The semiconductor device or the crystal of claim 6, wherein $0.1 \leq X1$ and $0.1 \leq Z1$.

9. The semiconductor device or the crystal of claim 6, wherein
  the base substrate is formed from α-sapphire, and
  the insulating film is formed from $\alpha\text{-}Al_{Y2}Ga_{Z2}O_3$ where $0 \leq Y2 \leq 2$, $0 \leq Z2 \leq 2$, and $Y2+Z2=1.5$ to $2.5$.

10. The semiconductor device or the crystal of claim 9, wherein $0.1 \leq X2$ and $0.1 \leq Y2$.

11. The semiconductor device or the crystal of claim 1, wherein
  a crystalline stress relaxation layer having a corundum crystal structure is disposed between the base substrate and the semiconductor layer.

12. The semiconductor device or the crystal of claim 11, wherein
  the base substrate is formed from α-sapphire,
  the crystalline stress relaxation layer comprises one or more layers and is formed from $\alpha\text{-}Al_{X1}Ga_{Y1}O_3$ where $0 \leq X1 \leq 2$, $0 \leq Y1 \leq 2$, and $X1+Y1=1.5$ to $2.5$ and where the amount of Al is gradually reduced from the base substrate toward the semiconductor layer,
  the semiconductor layer is formed from $\alpha\text{-}In_{X2}Al_{Y2}Ga_{Z2}O_3$ where $0 \leq X2 \leq 2$, $0 \leq Y2 \leq 2$, $0 \leq Z2 \leq 2$, and $X2+Y2+Z2=1.5$ to $2.5$, and the insulating film is formed from $\alpha\text{-}Al_{X3}Ga_{Y3}O_3$ where $0 \leq X3 \leq 2$, $0 \leq Y3 \leq 2$, and $X3+Y3=1.5$ to $2.5$.

13. The semiconductor device or the crystal of claim 1, wherein
  a cap layer comprising at least one of elements included in the semiconductor layer and the insulating film is disposed between the semiconductor layer and the insulating film.

14. The semiconductor device or the crystal of claim 13, wherein
  the base substrate is formed from α-sapphire,
  the semiconductor layer is formed from impurity-doped $\alpha\text{-}In_{X2}Al_{Y2}Ga_{Z2}O_3$ where $0 \leq X2 \leq 2$, $0 \leq Y2 \leq 2$, $0 \leq Z2 \leq 2$, and $X2+Y2+Z2=1.5$ to $2.5$,
  the cap layer is formed from $\alpha\text{-}Al_{X3}Ga_{Y3}O_3$ where $0 \leq X3 \leq 2$, $0 \leq Y3 \leq 2$, and $X3+Y3=1.5$ to $2.5$ and where the amount of Al is gradually increased from the semiconductor layer toward the insulating film, and
  the insulating film is formed from $\alpha\text{-}Al_{X4}Ga_{Y4}O_3$ where $0 \leq X4 \leq 2$, $0 \leq Y4 \leq 2$, and $X4+Y4=1.5$ to $2.5$.

15. The semiconductor device or the crystal of claim 14, wherein a crystalline stress relaxation layer having a corundum crystal structure is disposed between the base substrate and the semiconductor layer, and the crystalline stress relaxation layer comprises one or more layers and is formed from $\alpha\text{-Al}_{X1}\text{Ga}_{Y1}\text{O}_3$ where $0 \leq X1 \leq 2$, $0 \leq Y1 \leq 2$, and $X1+Y1=1.5$ to $2.5$ and where the amount of Al is gradually reduced from the base substrate toward the semiconductor layer.

16. The semiconductor device or the crystal of claim 1, wherein a structural phase transition prevention layer comprising at least one of elements included in the semiconductor layer and the insulating film is disposed between the semiconductor layer and the insulating film.

17. The semiconductor device or the crystal of claim 16, wherein the semiconductor layer is formed from impurity-doped $\alpha\text{-In}_{X1}\text{Al}_{Y1}\text{Ga}_{Z1}\text{O}_3$ where $0 \leq X1 \leq 2$, $0 \leq Y1 \leq 2$, $0 \leq Z1 \leq 2$, and $X1+Y1+Z1=1.5$ to $2.5$, the structural phase transition prevention layer is formed from $\alpha\text{-Al}_{X2}\text{Ga}_{Y2}\text{O}_3$ where $0 \leq X2 \leq 2$, $0 \leq Y2 \leq 2$, and $X2+Y2=1.5$ to $2.5$ and where the amount of Al is gradually increased from the semiconductor layer toward the insulating film, and the insulating film is formed from $\alpha\text{-Al}_{X3}\text{Ga}_{Y3}\text{O}_3$ where $0 \leq X3 \leq 2$, $0 \leq Y3 \leq 2$, and $X3+Y3=1.5$ to $2.5$.

18. A semiconductor device or a crystal comprising:
a support substrate;
a semiconductor layer; and
an insulating film, wherein:
    the semiconductor layer and the insulating film are disposed on the support substrate in this order or in a order reverse to this order,
    the support substrate has or does not have a corundum crystal structure,
    both the semiconductor layer and the insulating film have a corundum crystal structure, and
    a joining layer joining the support substrate and a corundum crystal is disposed between the support substrate and the semiconductor layer.

19. The semiconductor device or the crystal of claim 18, wherein the support substrate is formed from one of a SiC substrate, a Si substrate, a metal substrate, a ceramic substrate, and a glass substrate.

20. The semiconductor device or the crystal of claim 18, wherein the joining layer is formed from a silicon oxide film.

* * * * *